US006608315B1

(12) United States Patent
Saadatmand et al.

(10) Patent No.: US 6,608,315 B1
(45) Date of Patent: Aug. 19, 2003

(54) MECHANISM FOR PREVENTION OF NEUTRON RADIATION IN ION IMPLANTER BEAMLINE

(76) Inventors: Kourosh Saadatmand, 6 Willowdale Dr., Merrimac, MA (US) 01860; Michael A. Graf, 3 Locust Ter., Cambridge, MA (US) 02138; Edward K. McIntyre, 34 Jefferson Rd., Franklin, MA (US) 02038

( * ) Notice: Subject to any disclaimer, the term of this patent is extended or adjusted under 35 U.S.C. 154(b) by 141 days.

(21) Appl. No.: 09/703,769

(22) Filed: Nov. 1, 2000

(51) Int. Cl.[7] ............................................... H01J 37/317
(52) U.S. Cl. .................................................. 250/492.21
(58) Field of Search .......................... 250/492.2, 492.21

(56) References Cited

U.S. PATENT DOCUMENTS

| | | | |
|---|---|---|---|
| 4,266,132 A | | 5/1981 | Marshall, III ................ 250/359 |
| 4,560,879 A | * | 12/1985 | Wu et al. .................. 250/492.2 |
| 5,118,936 A | * | 6/1992 | Purser ......................... 250/281 |
| 5,334,847 A | | 8/1994 | Kronberg ................. 250/506.1 |
| 5,629,528 A | * | 5/1997 | Jost et al. ............... 250/492.21 |
| 5,689,112 A | * | 11/1997 | Enge et al. .................. 250/297 |
| 5,760,409 A | * | 6/1998 | Chen et al. ............ 250/492.21 |
| 5,780,863 A | | 7/1998 | Benveniste et al. ..... 250/492.21 |
| 5,786,611 A | | 7/1998 | Quapp et al. ............. 250/515.1 |
| 5,834,786 A | * | 11/1998 | White et al. ........... 250/492.21 |
| 5,932,883 A | * | 8/1999 | Hashimoto et al. ..... 250/492.21 |
| 5,947,053 A | * | 9/1999 | Burnham et al. ...... 250/492.21 |
| 6,208,095 B1 | * | 3/2001 | DiVergilio et al. ...... 250/492.21 |
| 6,262,638 B1 | * | 7/2001 | Scherer .................. 250/492.21 |
| 6,313,475 B1 | * | 11/2001 | Renau et al. ........... 250/492.21 |

OTHER PUBLICATIONS

CRC Handbook of Chemistry and Physics 59th Edition 1978–1979 B–278.*

* cited by examiner

Primary Examiner—John R. Lee
Assistant Examiner—Johnnie L Smith, II
(74) Attorney, Agent, or Firm—Kastelic; Dennis A. Robitaille

(57) ABSTRACT

A mass analysis magnet assembly (16) is provided for use in an ion implanter (10), comprising: (i) a magnet (44) for mass analyzing an ion beam (15) output by an ion source (14), the magnet providing an interior region (49) through which the ion beam passes; and (ii) at least one strike plate (48) in part forming an outer boundary of the interior region (49). The at least one strike plate is comprised of an isotopically pure carbon-based material. The isotopically pure carbon-based material, preferably by mass greater than 99% carbon C-12, prevents neutron radiation when impacted by deuterons extracted from the ion source (14). The strike plate (48) may comprise an upper layer (56) of isotopically pure carbon C-12 isotope positioned atop a lower substrate (54).

11 Claims, 3 Drawing Sheets

MECHANISM FOR PREVENTION OF NEUTRON RADIATION IN ION IMPLANTER BEAMLINE

RELATED APPLICATION

The following U.S. patent application is incorporated by reference herein as if it had been fully set forth: application Ser. No. 09/703,759, filed Nov. 1, 2000, entitled "Mechanism for Containment of Neutron Radiation in Ion Implanter Beamline".

FIELD OF THE INVENTION

The present invention relates generally to ion implantation systems and more particularly to a mechanism for preventing the generation of neutron radiation within the beamline of such systems, especially high-energy ion implantation systems.

BACKGROUND OF THE INVENTION

Ion implantation has become the technology preferred by industry to dope semiconductors with impurities in the large-scale manufacture of integrated circuits. High-energy ion implanters are used for deep implants into a substrate. Such deep implants are required to create, for example, retrograde wells. Eaton GSD/HE and GSD/VHE ion implanters are examples of such high-energy implanters. These implanters can provide ion beams at energy levels up to 5 MeV (million electron volts). U.S. Pat. No. 4,667,111, assigned to the assignee of the present invention, Eaton Corporation, describes such a high-energy ion implanter.

Ion implanters operate at very high voltage levels. Typically, ions in the beam are accelerated and decelerated by electrodes and other components in the implanter that reside at differing voltage levels. For example, positive ions are extracted from an ion source, passed through a mass analysis magnet, and accelerated by electrodes having increasingly negative potentials. In a high-energy ion implanter, the ion beam accelerates as it passes through a radio frequency (RF) linear accelerator (linac). The ion beam progresses through the RF linac by passing through a series of acceleration stages (resonator modules) in which accelerating fields are produced by synchronizing the frequency of the RF voltage to the ion beam velocity.

Arsenic (As) and phosphorous (P) are two species that are often implanted in semiconductors as doping agents. Arsenic and phosphorous are typically injected into the ion source ionization as arsine ($AsH_3$) and phosphine ($PH_3$) gas, respectively, each of which includes hydrogen (H) as a carrier gas. Ionization of these gases within the ionization chamber often produces small amounts of deuterium, an isotope of hydrogen. The ion beam that is extracted from the ion source often includes deuterons, which are nuclei of deuterium atoms, each comprising a proton and a neutron. The deuterons are thus subatomic particles having a unit positive charge.

The deuterons extracted from the ion source are transported along with the ion beam to the mass analysis magnet. The implantable ions having the correct charge-to-mass ratio (e.g., As+, As++, P+ and P++) pass through the mass analysis magnet and the particles having incorrect charge-to-mass ratios (e.g., deuterons) impact the interior sidewalls of the mass analysis magnet. These sidewalls are often lined with strike plates, typically constructed using graphite, which is a hexagonally crystallized allotrope of carbon (C).

Of the known isotopes of carbon, C-11 through C-15, C-12 and C-13, both of which are stable, are the most abundant. The number 12 in the C-12 (or 12C) designation represents the sum of the protons (6) and neutrons (6). Slightly less than 99% of the carbon isotopes found on earth are carbon C-12. Carbon C-13 (or 13C) has 7 neutrons and 6 protons in its nucleus. Approximately 1.1% of all carbon atoms are made of this isotope.

The graphite used to create mass analysis magnet strike plates generally comprises both carbon C-12 and smaller amounts of carbon C-13 isotopes. However, if deuterons impact the strike plate, a nuclear reaction may occur involving the incident deuteron and the nucleus of the C-13 atom within the composite C-12 and C-13 graphite structure. Such nuclear reaction may release a neutron with significant energy (up to approximately 5 MeV). Radiation of these neutrons from the surface of the strike plate is undesirable. Neutron radiation caused by deuteron collisions with carbon C-13 isotopes in strike plates is especially problematic in high-energy ion implanters, where high beam energies can increase the generation of neutron radiation.

It is an object of the present invention, then, to provide an ion implanter beamline that prevents or minimizes the generation of neutron radiation during operation of the implanter. It is a further object to provide such a beamline in the form of an improved mass analysis magnet strike plate.

SUMMARY OF THE INVENTION

A mass analysis magnet assembly is provided for use in an ion implanter, comprising: (i) a magnet for mass analyzing an ion beam output by an ion source, the magnet providing an interior region through which the ion beam passes; and (ii) at least one strike plate in part forming an outer boundary of the interior region. The strike plate is comprised of an isotopically pure carbon-based material. The isotopically pure carbon-based material, preferably by mass greater than 99% carbon C-12, prevents neutron radiation when impacted by deuterons extracted from the ion source. The strike plate may comprise an upper layer of isotopically pure carbon C-12 isotope positioned atop a lower substrate.

DETAILED DESCRIPTION OF A PREFERRED EMBODIMENT OF THE INVENTION

Figure 1:
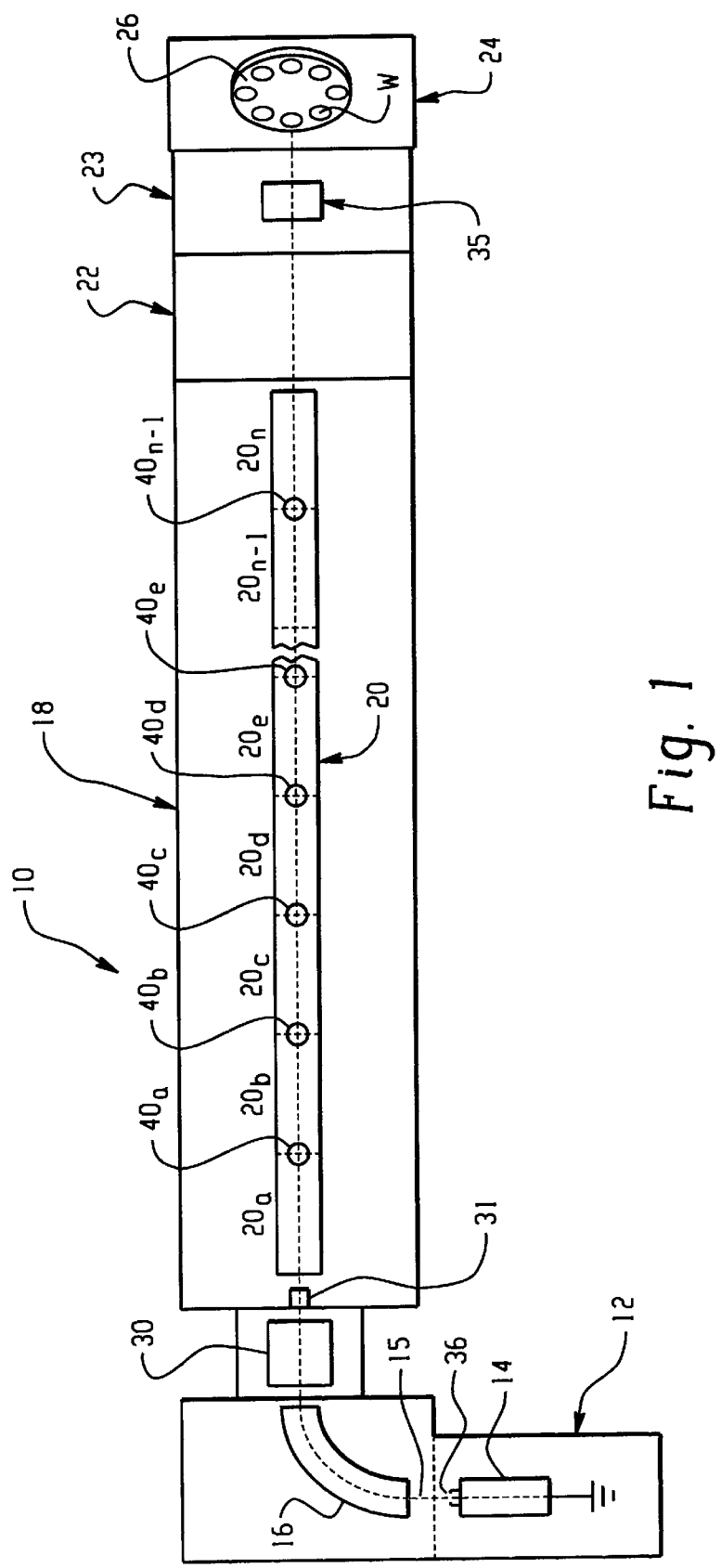
FIG. 1 is a schematic block diagram of a high-energy ion implanter into which is incorporated the present invention for reducing the generation of neutron radiation during operation thereof.

A cross sectional plan view of a high-energy ion implanter 10 is shown in FIG. 1. Although the invention is described herein as being incorporated into a mass analysis magnet assembly of a high-energy ion implanter, it is understood that the invention may be incorporated into ion implanter components other than mass analysis magnet assemblies, and in ion implanter types other than high-energy.

The implanter 10 comprises five sections or subsystems: an injector 12 including an ion source 14 for producing an ion beam 15 and a mass analysis magnet assembly 16 for mass analyzing the ion beam; a radio frequency (RF) linear accelerator (linac) 18 including a plurality of resonator modules 20a–20n for accelerating the ion beam to a higher energy; a final energy magnet (FEM) 22 for performing final mass analysis of the accelerated ion beam; a resolver housing 23 for final resolution and conditioning of the ion beam; and an end station 24 which contains a rotating disc 26 carrying wafers W to be implanted by the ion beam. It is also contemplated that the rotating disc 26 may be replaced with a single wafer pedestal as in a serial ion implanter.

Positioned after the mass analysis magnet assembly 16 at the entrance to the linac 18 is a variable aperture 30 for controlling the amount of beam current passing into the linac. Immediately downstream of the aperture 30 is a first flag Faraday 31 for measuring the beam current out of the aperture 30 and into the linac 18. A second flag Faraday 35 is located in the resolver housing 23 for measuring the current of the ion beam prior to implanting into the wafer W.

The ion beam 15 that is extracted from the ion source 14 passes through a source defining aperture 36 (see also FIG. 2) prior to entering the mass analysis magnet assembly 16. The ion beam that passes through the mass analysis magnet assembly 16 is typically comprised of a single isotope and enters the RF linac 18 which imparts additional energy to the ion beam passing therethrough. The RF linac produces particle accelerating fields which vary periodically with time, the phase of which may be adjusted to accommodate different atomic number particles as well as particles having different speeds. Each of the plurality of resonator modules 20 in the RF linac 18 functions to further accelerate ions beyond the energies they achieve from a previous module.

Intermediate each of the resonator modules 20 is an electrostatic quadrupole lens 40. The quadrupole lens 40 refocuses the ion beam passing therethrough, to counter the effect of net radial defocusing as the ion beam passes through a particular resonator module 20. Although not shown in FIG. 1, quadrupole lenses may also be positioned immediately before and after the RF linac 18.

Figure 2:
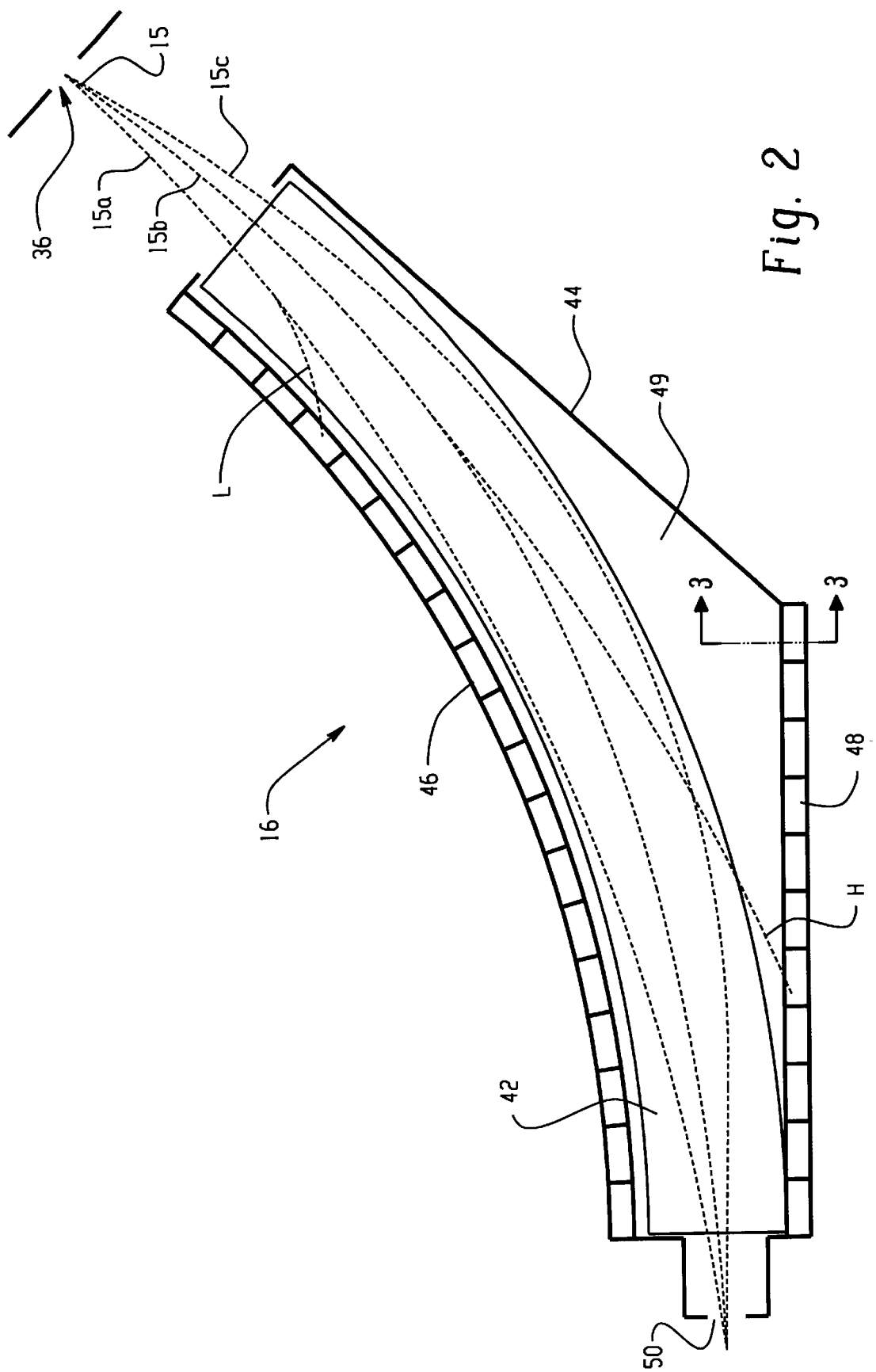
FIG. 2 a plan view of the interior of the mass analysis magnet assembly which is shown in block form in FIG. 2.

FIG. 2 shows the mass analysis magnet assembly 16 in more detail. The magnet assembly 16 includes a magnet 42 enclosed within a housing 44. The magnet 42 includes a yoke (not shown) bounded by field coils (not shown). The current flowing through the coils controls the strength and orientation of the magnetic field. One side of the interior of the housing 44 is lined with a strike plate 46, and a portion of the other side is lined with a strike plate 48.

The mass analysis magnet assembly 16 functions to pass to the RF linac 18 only the ions generated by the ion source 14 having an appropriate charge-to-mass ratio. The mass analysis magnet is required because the ion source 14, in addition to generating ions of appropriate charge-to-mass ratio, also generates ions of greater or lesser charge-to-mass ratio than that desired to be implanted. Ions having inappropriate charge-to-mass ratios are not suitable for implantation into the wafer. The ion beam that passes through an interior region 49 of the mass analysis magnet is focused at a resolving aperture 50 prior to entering the RF linac 18.

The desired ions having appropriate charge-to-mass ratio move along path 15b, of more correctly, within the beam path envelope defined by paths 15a and 15c, since some degree of beam divergence occurs as a result of the repulsive force of the like-charged (positive) ions in the beam. A path labeled L illustrates the trajectory path of an undesirable ion which has a charge-to-mass ratio which is larger (i.e., the atomic mass of the ion is too low or light) than the desired charge-to-mass ratio of the species being implanted. A path labeled H illustrates the trajectory path of an undesirable ion which has a charge-to-mass ratio which is smaller (i.e., the atomic mass of the ion is too high or heavy) than the desired charge-to-mass ratio of the species being implanted.

The trajectory of the light ions (path L) is affected more by the magnetic field than the trajectory of the desired ions and these light ions impact the strike plate 46. The trajectory of the heavy ions (path H) is not affected by the magnetic field as much as the trajectory of the desired ions and these heavy ions impact the strike plate 48. Included within the light ions that impact strike plate 46 are deuterons which have been extracted from the ion source. Some deuterons may also be carried along with the neutralized portion of the ion beam along path H and impact strike plate 48. The strike plates 46 and 48 in part form an outer boundary for the magnet interior region 49.

Figure 3:
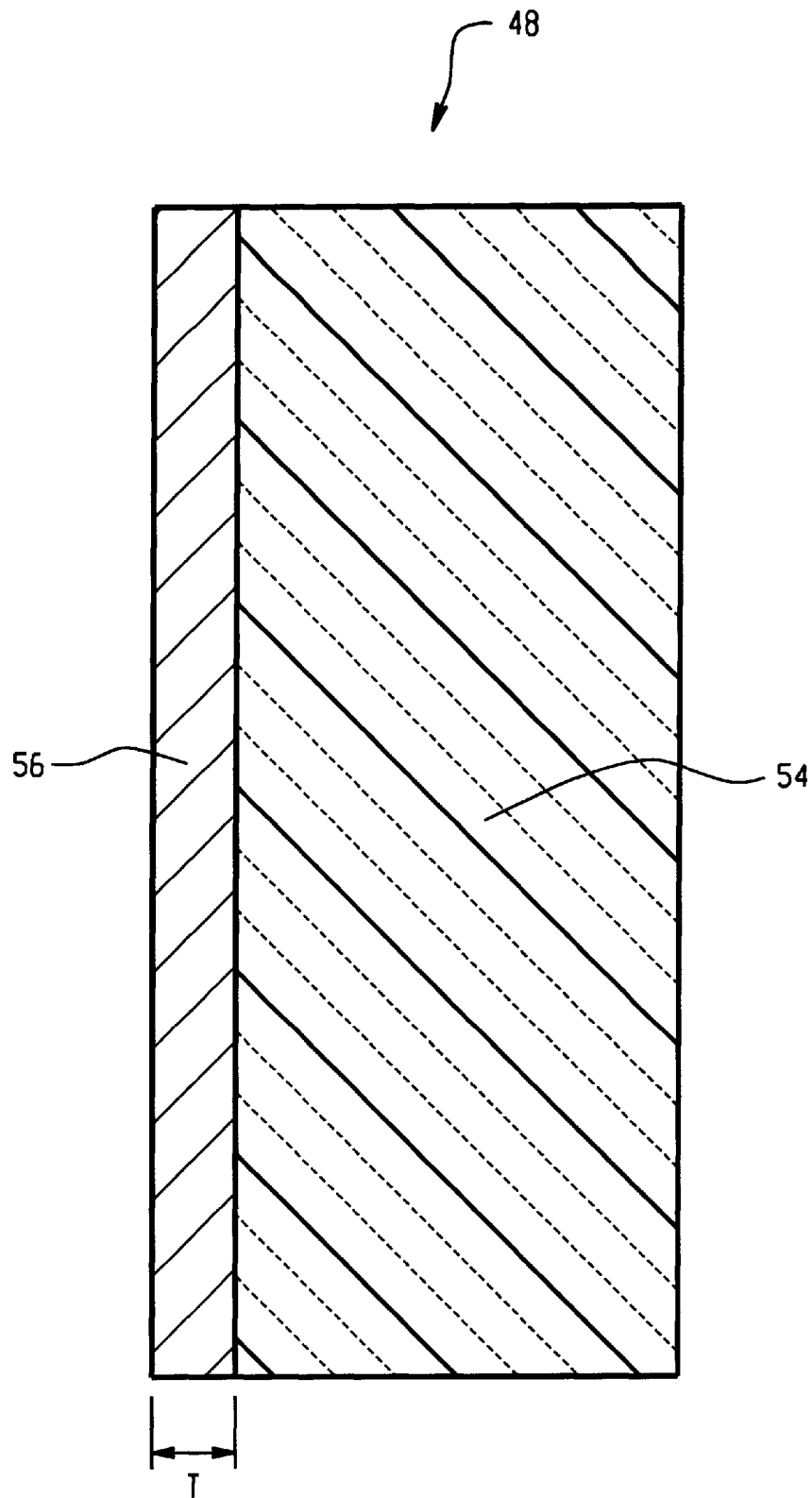
FIG. 3 is a cross sectional view of the strike plate contained within the mass analysis magnet assembly of FIG. 2, taken along the lines 3—3.

In the present invention, at least strike plate 48 (and preferably also strike plate 46) is made of a carbon-based material that will not generate neutron radiation when struck by deuterons. For example, the strike plates may be made of isotopically pure C-12, with no (or greatly reduced) C-13 component. At a minimum, the surface of these strike plates should be covered with this type of material (see FIG. 3). As shown in FIG. 3, a substrate 54 comprises a composite material comprised of both carbon C-12 and C-13 isotopes. Positioned atop the substrate is a thinner layer 56 of isotopically pure (C-13 free) carbon C-12. By isotopically pure, it is meant that the layer 56 contains by mass less than the naturally occurring amount of carbon C-13 (approximately 1.1%). Accordingly, the layer 56 contains by mass preferably less than 1% of carbon C-13 and even more preferably, less than 0.5%. The layer has a thickness T of approximately 12 microns ($\mu$m). Although not shown in FIG. 3, strike plate 46 may be constructed in a similar fashion.

Although the invention has been described in terms of a strike plate for a mass analysis magnet, it is contemplated that the isotopically pure carbon C-12 can be used to construct other components in an ion implanter. For example, aperture plates, electrodes, and quadrupoles may be constructed of this material. The invention can be thereby be used to prevent generation of neutron radiation along the entire beamline of an ion implanter by utilizing isotopically pure carbon C-12 to construct components of the implanter that are likely to be struck by the ion beam passing therethrough.

Accordingly, a preferred embodiment of a mechanism for prevention of neutron radiation in an ion implanter beamline has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A mass analysis magnet assembly (16) for use in an ion implanter (10), comprising:
   (i) a magnet (44) for mass analyzing an ion beam (15) output by an ion source (14), said magnet providing an interior region (49) through which the ion beam passes; and
   (ii) at least one strike plate (48) in part forming an outer boundary of the interior region (49), said at least one strike plate comprised of substantially isotopically pure carbon-based material consisting essentially of a substantially isotopically pure carbon C-12 isotope, preventing neutron radiation when impacted by deuterons extracted from the ion source (14).

2. The mass analysis magnet assembly (16) of claim 1, wherein said isotopically pure carbon C-12 isotope comprises greater than 99% by mass of said at least one strike plate.

3. The mass analysis magnet assembly (16) of claim 2, wherein said isotopically pure carbon C-12 comprises greater than 99.5% by mass of said at least one strike plate.

4. The mass analysis magnet assembly (16) of claim 2, wherein said at least one strike Plate comprises two strike plates (46, 48).

5. The mass analysis magnet assemble (16) of claim 2, wherein said at least one strike plate (48) comprises an upper layer (56) of isotopically pure carbon C-12 isotope positioned atop a lower substrate (54).

6. The mass analysis magnet assembly (16) of claim 5, wherein said upper layer (56) has a thickness T of approximately 12 microns ($\mu$m).

7. A beamline component for use in a balance (20, 22, 23, 30) an ion implanter (10), said component strikeable by an ion beam (15) output by an ion source (14) of the implanter; said component comprised of a substantially isotopically pure carbon-based material consisting essentially of a substantially isotopically pure carbon C-12 isotope, for preventing neutron radiation when impacted by deuterons extracted from the ion source (14).

8. The beamline component of claim 7, wherein said isotopically pure carbon C-12 isotope comprises greater than 99% by mass of said beamline component.

9. The beamline component of claim 8, wherein said isotopically pure carbon C-12 isotope comprises greater than 99.5% by mass of said beamline component.

10. The beamline component (16) of claim 8, wherein said beamline component comprises an upper layer (56) of isotopically pure carbon C-12 isotope positioned atop a lower substrate (54).

11. The beamline component (16) of claim 10, wherein said upper layer (56) has a thickness T of approximately 12 microns ($\mu$m).

* * * * *